(12) United States Patent
Su

(10) Patent No.: US 8,318,522 B2
(45) Date of Patent: Nov. 27, 2012

(54) SURFACE PASSIVATION TECHNIQUES FOR CHAMBER-SPLIT PROCESSING

(75) Inventor: Jie Su, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 44 days.

(21) Appl. No.: 12/966,636

(22) Filed: Dec. 13, 2010

(65) Prior Publication Data

US 2011/0143471 A1    Jun. 16, 2011

Related U.S. Application Data

(60) Provisional application No. 61/286,696, filed on Dec. 15, 2009.

(51) Int. Cl.
*H01L 21/20* (2006.01)

(52) U.S. Cl. ............ 438/38; 438/46; 438/507; 438/508; 257/13; 257/76; 257/E21.09; 257/E33.023

(58) Field of Classification Search .................... 438/38, 438/46, 507, 508; 257/13, 76, E21.09, E33.023
See application file for complete search history.

(56) References Cited

U.S. PATENT DOCUMENTS

| | | | | |
|---|---|---|---|---|
| 5,686,738 | A * | 11/1997 | Moustakas | 257/103 |
| 6,927,417 | B2 * | 8/2005 | Nagashima et al. | 257/55 |
| 7,611,915 | B2 * | 11/2009 | Slater et al. | 438/27 |
| 2003/0017624 | A1 * | 1/2003 | Yamamoto et al. | 438/3 |
| 2007/0240631 | A1 * | 10/2007 | Nijhawan et al. | 117/98 |
| 2011/0147704 | A1 * | 6/2011 | Jiang et al. | 257/13 |

* cited by examiner

*Primary Examiner* — Hsien Ming Lee
*Assistant Examiner* — Walter H Swanson
(74) *Attorney, Agent, or Firm* — Blakely Sokoloff Taylor Zafman LLP

(57) ABSTRACT

Surface passivation techniques for chamber-split processing are described. A method includes forming a first Group III-V material layer above a substrate, the first Group III-V material layer having a top surface. A passivation layer is deposited on the top surface of the Group III-V material layer. The passivation layer is removed. Subsequently, a second Group III-V material layer is formed above the first Group III-V material layer.

10 Claims, 8 Drawing Sheets

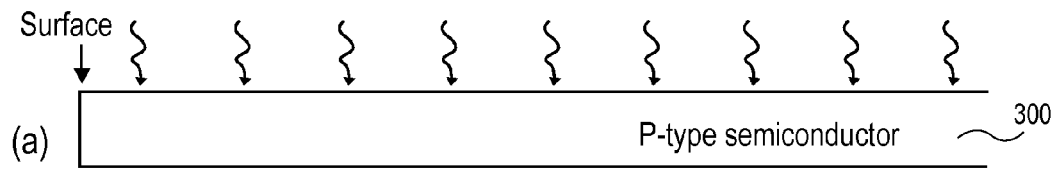
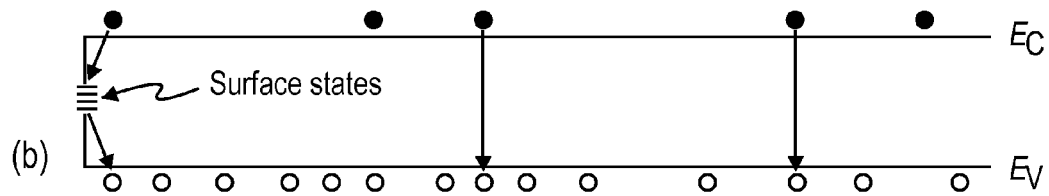
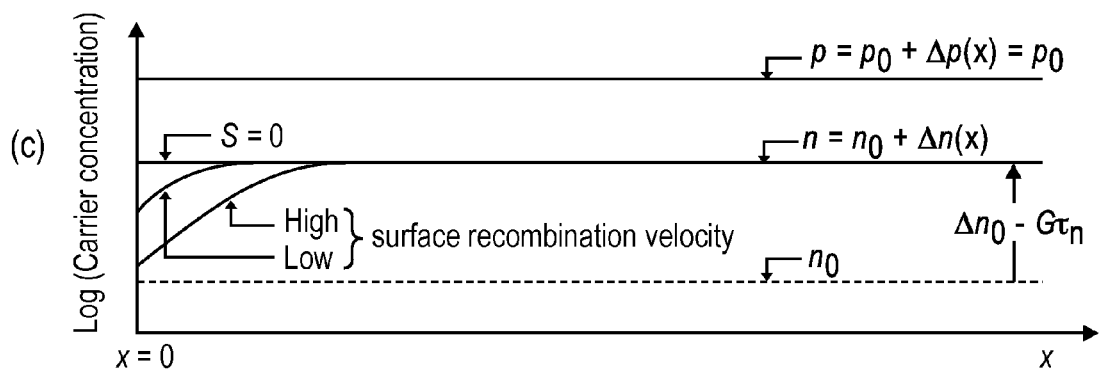
| Semiconductor | Surface recombination velocity |
|---|---|
| GaAs | $S = 10^6$ cm/s |
| GaN | $S = 5 \times 10^4$ cm/s |
| InP | $S = 10^3$ cm/s |
| Si | $S = 10^1$ cm/s |
FIG. 3

SURFACE PASSIVATION TECHNIQUES FOR CHAMBER-SPLIT PROCESSING

CROSS-REFERENCE TO RELATED APPLICATIONS

This application claims the benefit of U.S. Provisional Application No. 61/286,696, filed Dec. 15, 2009, the entire contents of which are hereby incorporated by reference herein.

BACKGROUND

1) Field

Embodiments of the present invention pertain to the field of light-emitting diode fabrication, in particular, to surface passivation techniques for multiple-chamber split processes.

2) Description of Related Art

Group III-V materials are playing an ever increasing role in the semiconductor and related, e.g. light-emitting diode (LED), industries. Often, group III-V materials are sensitive to ambient conditions and care must be taken to avoid such conditions at particular periods of the fabrication process. However, avoiding interaction of a sensitive group III-V film with potential damaging conditions is not straightforward in many applications.

BRIEF DESCRIPTION OF THE DRAWINGS

FIG. 3 illustrates a concept diagram of non-radiative recombination in an LED device, in accordance with an embodiment of the present invention.

DETAILED DESCRIPTION

Figure 1:
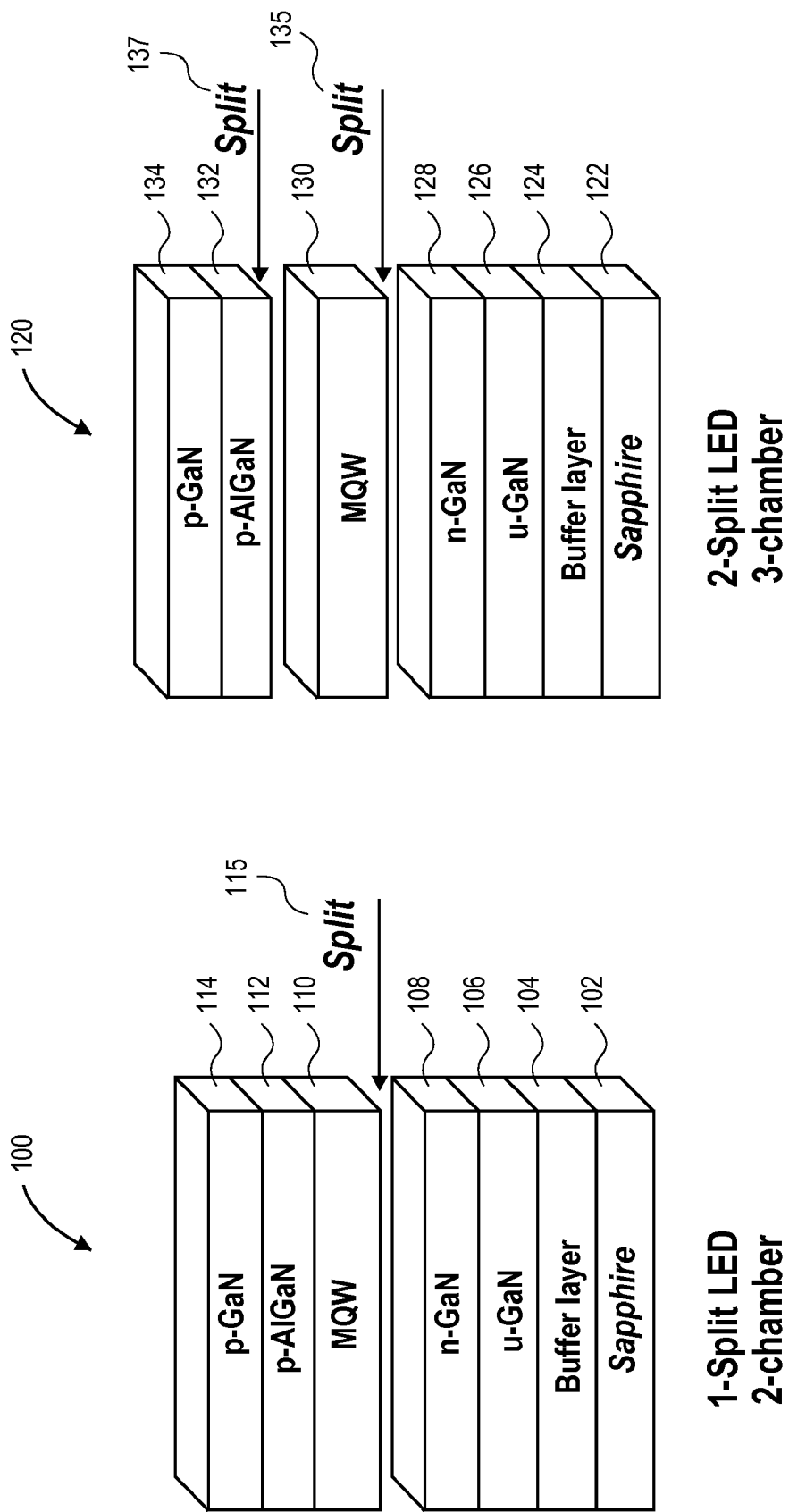
FIG. 1 illustrates cross-sectional views of partially completed LED stacks with indication of where the fabrication process was split relative to respective layers in the stacks, in accordance with an embodiment of the present invention.

Surface passivation techniques for chamber-split processing are described. In the following description, numerous specific details are set forth, such as fabrication conditions and material regimes, in order to provide a thorough understanding of embodiments of the present invention. It will be apparent to one skilled in the art that embodiments of the present invention may be practiced without these specific details. In other instances, well-known features, such as facility layouts or specific tool configurations, are not described in detail in order to not unnecessarily obscure embodiments of the present invention. Furthermore, it is to be understood that the various embodiments shown in the Figures are illustrative representations and are not necessarily drawn to scale. Additionally, other arrangements and configurations may not be explicitly disclosed in embodiments herein, but are still considered to be within the spirit and scope of the invention.

Disclosed herein are surface passivation techniques for multiple-chamber split processes. In one embodiment, surface passivation by a thin layer of metallic species, or other compound layer, is used to preserve the top surface of a layer during a split in chamber processing of an LED stack.

Light-emitting diode (LED) and related devices may be fabricated from layers of, e.g., group films. In accordance with an embodiment of the present invention, several group films formed in the fabrication of an LED device are fabricated in different reaction chambers, leading to a split chamber process in which one or more such layers are exposed to ambient or atmospheric conditions. In one embodiment, the LED split process can be carried out in a single chamber configuration, e.g., by using the same chamber before and after a growth process is interrupted. Such an interruption may occur when a growth process is interrupted for an in-situ chamber clean or bake.

An LED split process may be used for the growth interruption between a p-type AlGaN and a stack of multi-layer quantum-well (MQW) layers. Such a split process may lead to an overall EL intensity reduced by 10-70% as compared with an LED fabrication without the growth interruption. The root cause of the deterioration is likely due to non-radiative surface recombination which occurs in the interface of the p-type AlGaN and the top surface of the MQW. Surface defects may be the most common cause for non-radiative surface recombination, which include the following: 1) foreign impurities, 2) group-III and group-V vacancies, 3) group-III and group-V interstitials, 4) dangling bonds, 5) misfit dislocation, and 6) surface reconstruction. Nonetheless, the formation of LEDs by split processes has some advantages, such as less cross contamination between indium and magnesium, minimized drifting of LED wavelength and uniformity, and abrupt doping profiles near the interface. As such, in accordance with an embodiment of the present invention, minimizing the surface defects and unwanted foreign impurities reduces the non-radiative surface recombination that may result from spilt chamber processing.

Key concepts pertaining to various embodiments of the present invention may lead to improvements through surface passivation techniques for multiple-chamber split processes. Such concepts may include: (a) surface recombination mitigation, (b) metal-organic chemical vapor deposition (MOCVD), (c) surface passivation, (d) non-radiative recombination, and (e) surface treatment.

Split processes, e.g., moving a partially fabricated LED material stack from one chamber to another or from one production tool to another in the middle of the fabrication process, may be represented as a "split" in the fabrication process indicating a growth interruption in the middle of the fabrication process before the completion of the full stacks of LED materials. The split process could also be carried out in a single chamber configuration. In one embodiment, the growth is interrupted and wafers are transferred into a load lock chamber from the process chamber. The process chamber might undergo a in situ chamber clean or bake before the returning of the wafers and resuming of the process.

FIG. 1 illustrates cross-sectional views of partially completed LED stacks with indication of where the fabrication process was split relative to respective layers in the stacks, in accordance with an embodiment of the present invention.

Referring to FIG. 1, a partially fabricated LED stack 100 includes a sapphire substrate 102, a buffer layer 104, an undoped gallium nitride layer 106, an n-doped gallium nitride layer 108, a multi-layer quantum-well 110, a p-doped aluminum gallium nitride layer 112, and a p-doped gallium nitride layer 114. A split 115 in the fabrication process indicates where the top surface of n-doped gallium nitride layer 108 is exposed to ambient or atmospheric conditions prior to formation of multi-layer quantum-well 110. An example, of a process flow or process tool used to fabricate LED stack 100 is a 2-chamber process flow or process tool.

Referring again to FIG. 1, a partially fabricated LED stack 120 includes a sapphire substrate 122, a buffer layer 124, an undoped gallium nitride layer 126, an n-doped gallium nitride layer 128, a multi-layer quantum-well 130, a p-doped aluminum gallium nitride layer 132, and a p-doped gallium nitride layer 134. A split 135 in the fabrication process indicates where the top surface of n-doped gallium nitride layer 128 is exposed to ambient or atmospheric conditions prior to formation of multi-layer quantum-well 130. A split 137 in the fabrication process indicates where the top surface of multi-layer quantum-well 130 is exposed to ambient or atmospheric conditions prior to formation of p-doped aluminum gallium nitride layer 132. An example, of a process flow or process tool used to fabricate LED stack 120 is a 3-chamber process flow or process tool. In accordance with an embodiment of the present invention, there is an EL intensity drop for the 2-split partially fabricated LED stack 120 as compared with the 1-split partially fabricated LED stack 100. In one embodiment, the EL intensity drop is approximately in the range of 10-50% and is related to the growth interruption between the p-AlGaN and the MQW. The 1-split and 2-split LED process can also be carried out in a single-chamber configuration. The wafers will be transferred to a load lock chamber and the process chamber will be baked or cleaned before loading back the wafers and resuming of the process.

Figure 2:
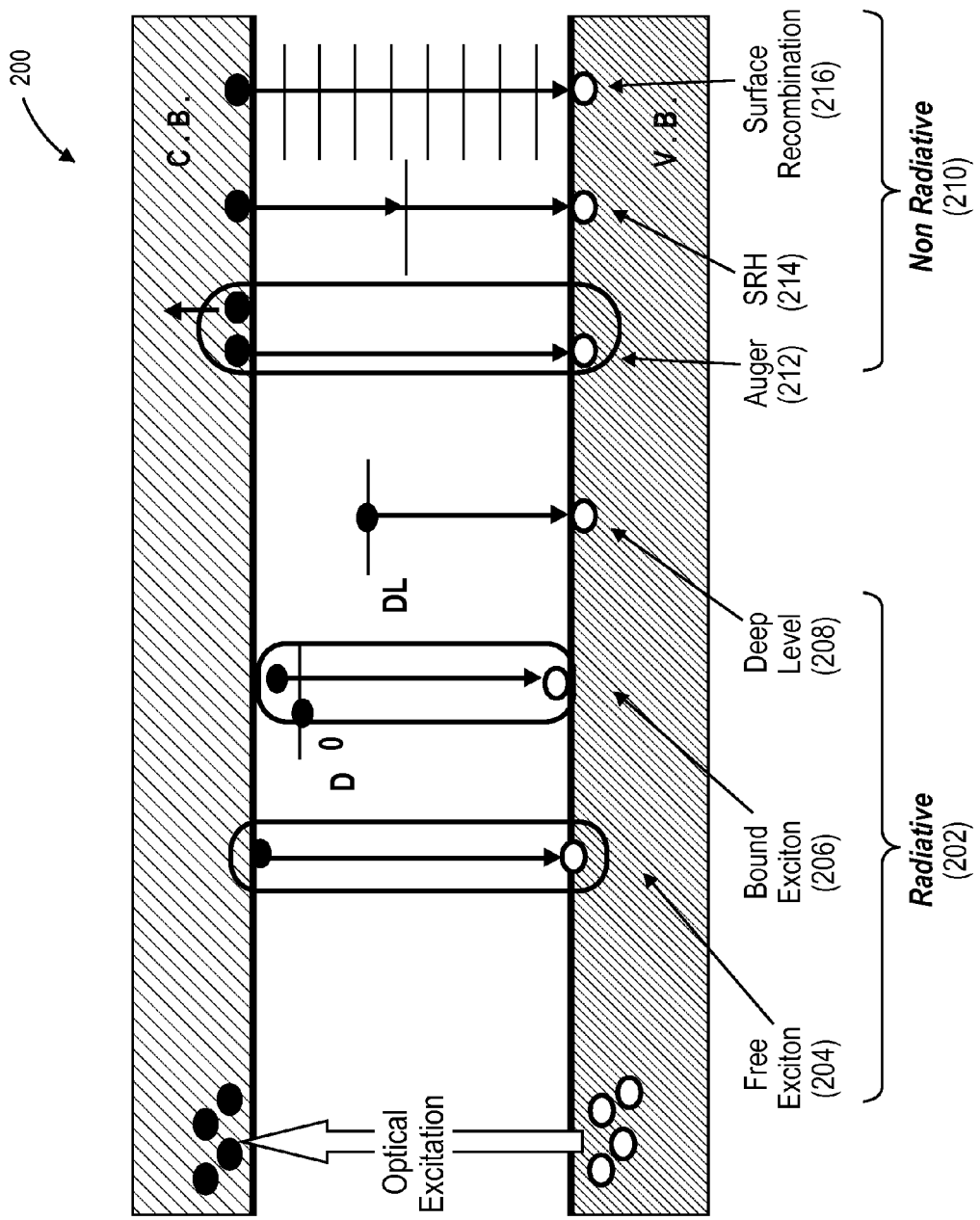
FIG. 2 illustrates a concept diagram of both radiative and non-radiative recombination in an LED device, in accordance with an embodiment of the present invention.

Non-radiative surface recombination may lead to a drop in efficiency of an LED device. FIG. 2 illustrates a concept diagram of both radiative and non-radiative recombination in an LED device, in accordance with an embodiment of the present invention.

Referring to FIG. 2, there are two basic recombination mechanisms in semiconductors, i.e. radiative recombination 202 and non-radiative recombination 210. Radiative recombination process 202 provides photons with energy equal to the bandgap energy of the semiconductor, which is the source of light from an LED device. Non-radiative recombination 210 will convert the electron energy into heat through the vibration of lattice atoms, i.e. phonons. The heat generated is undesirable and becomes a luminescence reducer for the LED device. Components of non-radiative recombination 210 include an auger recombination 212, an Shockley-Read-Hall (SRH) process via deep level 214, and a surface recombination event 216. Components of radiative recombination 202 may include a free exciton event 204, a bound exciton event 206, and a deep level event 208.

In at least some embodiments of the present invention, non-radiative surface recombination occurs at the interface of an LED device due to the process split and is the primary root cause of the drop in luminescence efficiency of the LED device. FIG. 3 illustrates a concept diagram of non-radiative recombination in an LED device, in accordance with an embodiment of the present invention.

Referring to FIG. 3, part (a) illustrates that surfaces can be viewed as a perturbation of the crystal periodicity in a substrate 300 or interface between two dissimilar layers with different lattice constant and chemical composition. Referring to parts (b) and (c) of FIG. 3, such a perturbation may lead to modifications of an energy band with additional electronic states in the forbidden gap. In accordance with an embodiment of the present invention, surface defects are the most common cause for non-radiative surface recombination. In one embodiment, such surface defects may be a defect such as, but not limited to, foreign impurities, group-III and group-V vacancies, group-III and group-V interstitials, dangling bonds at the surface, misfit dislocation, and surface reconstruction. However, that surface recombination may occur only when both types of carriers are present. Referring to Table 302 of FIG. 3, surface recombination velocities are provided for GaAs, GaN, InP and silicon.

Figure 4:
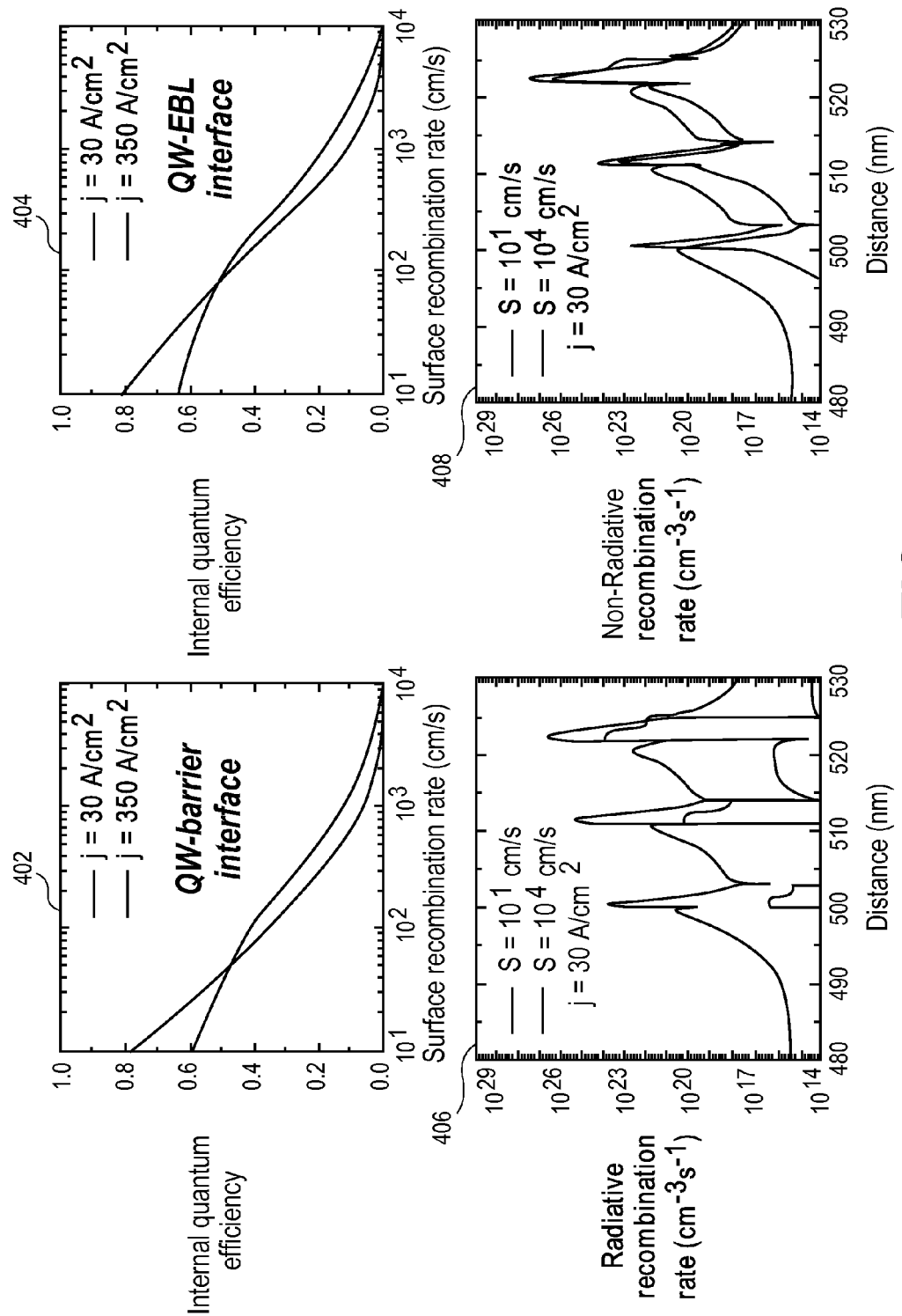
FIG. 4 illustrates plots pertaining to internal quantum efficiency (IQE), radiative recombination, and non-radiative recombination, in accordance with an embodiment of the present invention.

Surface recombination may impact the performance of an LED device. FIG. 4 illustrates plots pertaining to internal quantum efficiency (IQE) in accordance with an embodiment of the present invention. Referring to FIG. 4, plots 402 and 404 illustrate internal quantum efficiency as a function of surface recombination rate. The interface between the InGaN quantum well and GaN barrier, and the MQWs and the p-AlGaN layer may cause defects due to the difference in lattice constant. The defects may lead to non-radiative surface recombination at the interface. Plots 402 and 404 show the decrease of Internal Quantum Efficiency (IQE) as the increase in the surface recombination rate.

In addressing the above issues, improvements in EL intensity or mitigation of EL intensity loss may improve the performance of an LED device. In an embodiment, as described above, a cause of an EL drop in an LED device is due to non-radiative surface recombination at an interface of an MQW and an overlying p-AlGaN layer, which is caused by the surface defects from the growth interruption. In one embodiment, the resulting loss in EL is addressed by minimizing surface defects and foreign impurities in the MQW and overlying p-AlGaN layers. In a specific embodiment, surface removal of impurities is used. For example, removing several mono-layers from the surface of the MQW before the p-AlGaN is formed. This may be performed by, e.g., an $H_2$ treatment or an $NH_3$ treatment. In another specific embodiment, surface passivation is used. For example, surface passivation after the last barrier within the MQW by, e.g., a metallic In, Ga or Al or compound InN layer, which is removed before the growth of the p-AlGaN layer. In another specific embodiment, strain engineering is used. For example, strain effect (e.g., pseudomorphic or relaxed ending barrier) may be designed to facilitate the regrowth of p-AlGaN to minimize the misfit dislocations. In another embodiment, the split can be moved into the MQW region to ensure the split interface is away from the diffusion distance of holes from p-GaN. The surface passivation approach is the focus of the detailed discussion below. However, it is to be understood that, in an embodiment, a surface passivation approach can be combined with a surface treatment approach and/or a strain engineering approach.

Thus, in accordance with an embodiment of the present invention, surface passivation by a thin layer of metallic species, or other compound layer, is used to preserve the top surface of a III-V layer during a split in chamber processing of an LED stack. In one embodiment, the passivation layer or layers have low melting points or low decomposition-temperatures, and are easily removed before continuing the growth of a next permanent device layer or layers. In an embodiment, such an approach can be used for minimization of non-radiative surface recombination in LED grown by a split process, and can be also used as a general surface passivation technique for other device process requiring multiple-chamber split process.

In an embodiment, without use of a surface passivation layer, the LED split process with growth interruption between a p-AlGaN and the MQW layers leads to an overall EL intensity reduction of 10-70% compared with the LED without the growth interruption. However, this intensity reduction process may be mitigated or essentially eliminated with the use of a surface passivation layer. As an example, FIG. 5 illustrates an LED stack fabrication process with split chamber processing, in accordance with an embodiment of the present invention.

Figure 5:
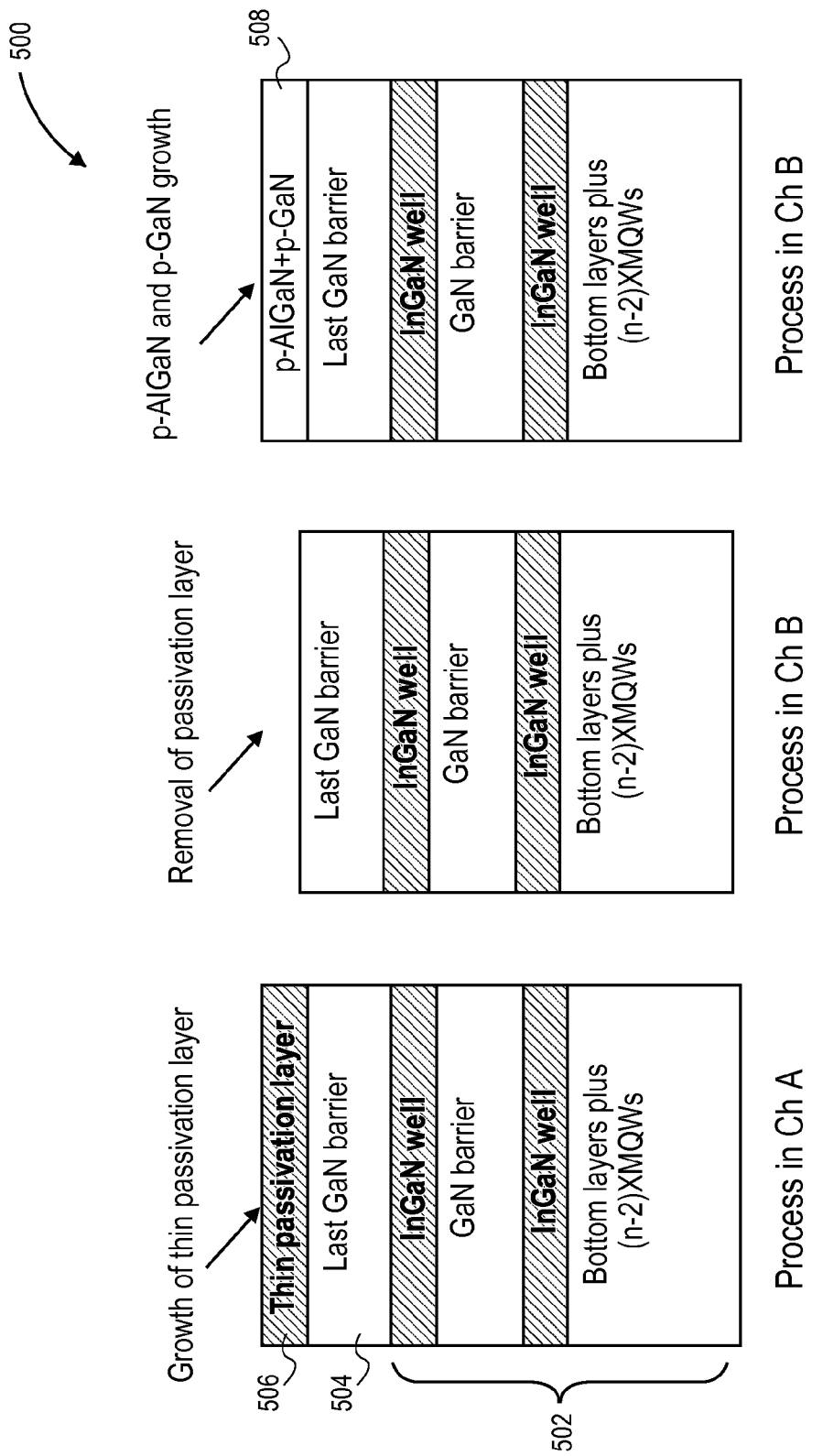
FIG. 5 illustrates an LED stack fabrication process with split chamber processing, in accordance with an embodiment of the present invention.

Referring to FIG. 5, a split deposition process 500 using a sacrificial passivation layer is illustrated. First, in process chamber A, a stack including multiple quantum well layers 502, a last III-V material layer, e.g. a gallium nitride barrier layer, 504 has a passivation layer 506 formed thereon while still in chamber A. In a specific embodiment, passivation layer is an amorphous layer. In a particular embodiment, passivation layer is an amorphous layer and is formed directly on last III-V material layer 504 which is crystalline. Next, in another process chamber B, passivation layer 506 is removed to again expose the top surface of last gallium nitride barrier layer 504. In a specific embodiment, the passivation layer is removed by a process such as, but not limited to, a temperature ramp or an $H_2$ purge. Finally, again in process chamber B, a p-type AlGaN and/or a p-type GaN layer 508 is formed on the top surface of last gallium nitride barrier layer 504, approximately where passivation layer 506 once existed.

Thus, in an embodiment of the present invention, a thin passivation layer is used on top of the last quantum well barrier of a partially completed LED device. In one embodiment, the passivation layer is a thin metallic layer (such as indium, gallium, or aluminum), or a compound layer (such as InN, SiN, InAlN, or InGaN). In a specific embodiment, the growth of the thin metallic layer of In, Ga, or Al is carried out by flowing trimethyl indium, trimethyl gallium, or trimethyl aluminum, respectively, into the same chamber that the last quantum well barrier was formed in, without removing the stack from the chamber until the passivation layer is formed. In a particular embodiment, the passivation layer is formed in an MOCVD chamber without $NH_3$ flow at a temperature approximately in the range of 300-700 degrees Celsius. In an embodiment, the thickness of passivation layer is several monolayers, but in an alternative embodiment, the thickness of passivation layer is in the range of tens or hundreds of monolayers, each monolayer being about 1-5 Angstroms.

In accordance with an embodiment of the present invention, features of a process using a surface passivation layer include, but are not limited to: 1) growth compatibility with device layers, e.g., no introduction of extra contaminations, no extra precursor or gases required, 2) better surface coverage or wetting property, e.g., the layer covers the surface uniformly without formation of islands or droplets, and/or 3) easy removal of the layer in a subsequently used chamber without the byproducts from removal introducing contaminants.

The above surface passivation approach is by no means limited to the embodiments provided above. For example, in another embodiment, other approaches may be combined with a surface passivation approach such as, but not limited to, 1) strain engineering of the last barrier layer prior to surface passivation, which can be carried out by introducing either a strained or a relaxed layer to facilitate the regrowth of a p-AlGaN layer to minimize misfit dislocations, 2) move the split interface into the MQW region such as into the last several MQWs (1 to 5 MQWs) into the same chamber as the p-AlGaN is formed to move the interface away from the diffusion distance of holes, or 3) manipulation of surface termination by modified growth conditions for the last barrier to achieve either an N-terminated or a Ga-terminated surface.

An LED stack may be formed by a split chamber process with one or more splits using a surface passivation layer for at least one of the splits. For example, FIGS. 6A and 6B illustrate cross-sections of a representative LED device, in accordance with an embodiment of the present invention.

Figure 6A:
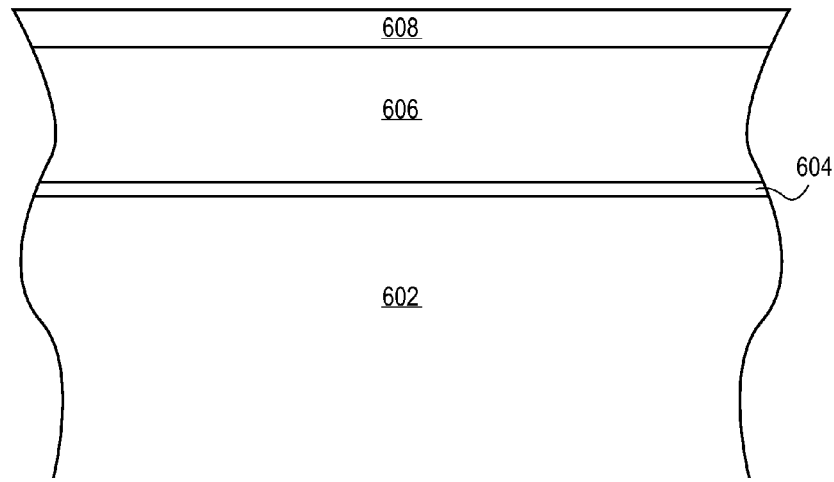
FIG. 6A illustrates a cross-section of a representative portion of an LED device, in accordance with an embodiment of the present invention.

Referring to FIG. 6A, a gallium nitride (GaN) single crystalline film 606 is epitaxially grown on a substrate 602. An optional buffer layer 604, such as an aluminum nitride (AlN) layer, a gallium nitride (GaN) layer, or related ternary aluminum gallium nitride (AlGaN) or indium gallium nitride (InGaN) alloy layers, may be formed between the gallium nitride (GaN) film 606 and the substrate 602. Substrate 602 may be any suitable single crystalline substrate upon which a gallium nitride (GaN) single crystalline film 606 may be formed. Substrate 602 may be any suitable substrate, such as but not limited to a sapphire ($Al_2O_3$) substrate, a silicon carbide (SiC) substrate, a silicon on diamond (SOD) substrate, a quartz ($SiO_2$) substrate, a glass substrate, a zinc oxide (ZnO) substrate, a magnesium oxide (MgO) substrate and a lithium aluminum oxide ($LiAlO_2$) substrate. In a specific embodiment, substrate 602 is a (0001) sapphire substrate. Sapphire substrates are the most common substrates used in manufacturing of LEDs.

Gallium nitride (GaN) film 606 may be a gallium nitride (GaN) film containing only gallium nitride (GaN) or may be a gallium nitride (GaN) alloy film, such as for an example aluminum gallium nitride (AlGaN). In an embodiment of the present invention, the aluminum gallium nitride film has a composition of $Al_xGa_{1-x}N(0 \leq x \leq 1)$. The gallium nitride film or alloy film can have a thickness between 2-500 microns is typically formed between 2-15 microns. In an embodiment of the present invention, the gallium nitride film has a thickness of at least 3 microns to sufficiently suppress threading dislocations.

Figure 6B:
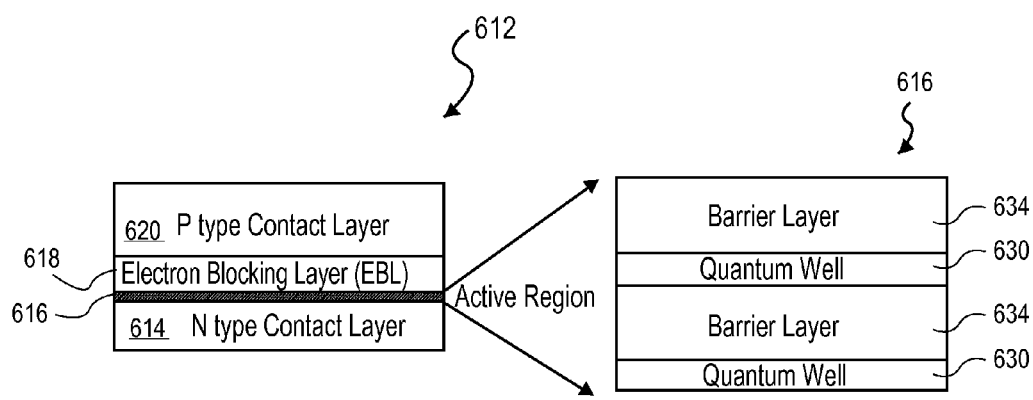
FIG. 6B illustrates a cross-section of a representative portion of an LED device, in accordance with an embodiment of the present invention.

Referring to FIG. 6B, LED device layers 608 (depicted as a single layer in FIG. 6A) may include an n type contact layer 614, an active region 616, an electron blocking layer 618, and a p type contact layer 620. The active region 616 may comprise a plurality of active layers including a single or multiple quantum wells 630, such as indium gallium nitride (InGaN), formed on a single or multiple barrier layers 634, such as gallium nitride (GaN). In an embodiment, one of the layers depicted in FIG. 6B is formed before or after using a surface passivation layer for at least one of the splits in a split chamber fabrication process.

Although reference above is to MOCVD chambers, an HVPE chamber may be used to deposit one or more layers in an LED stack processed by a split chamber fabrication process. The HVPE-deposited layer or layers could be a layer formed immediately before a split process, immediately after a split process, or neither immediately before or after a split process. For example, in one embodiment, an HVPE chamber is used to fabricate the last layer prior to deposition of an MQW in an MOCVD chamber. The MQW is then formed in the MOCVD chamber, splitting the process. Then, the first layer after formation of the MQW is formed in the same or another HVPE chamber, again splitting the process. A surface passivation layer is used at one or both of the splits in the process.

Figure 7:
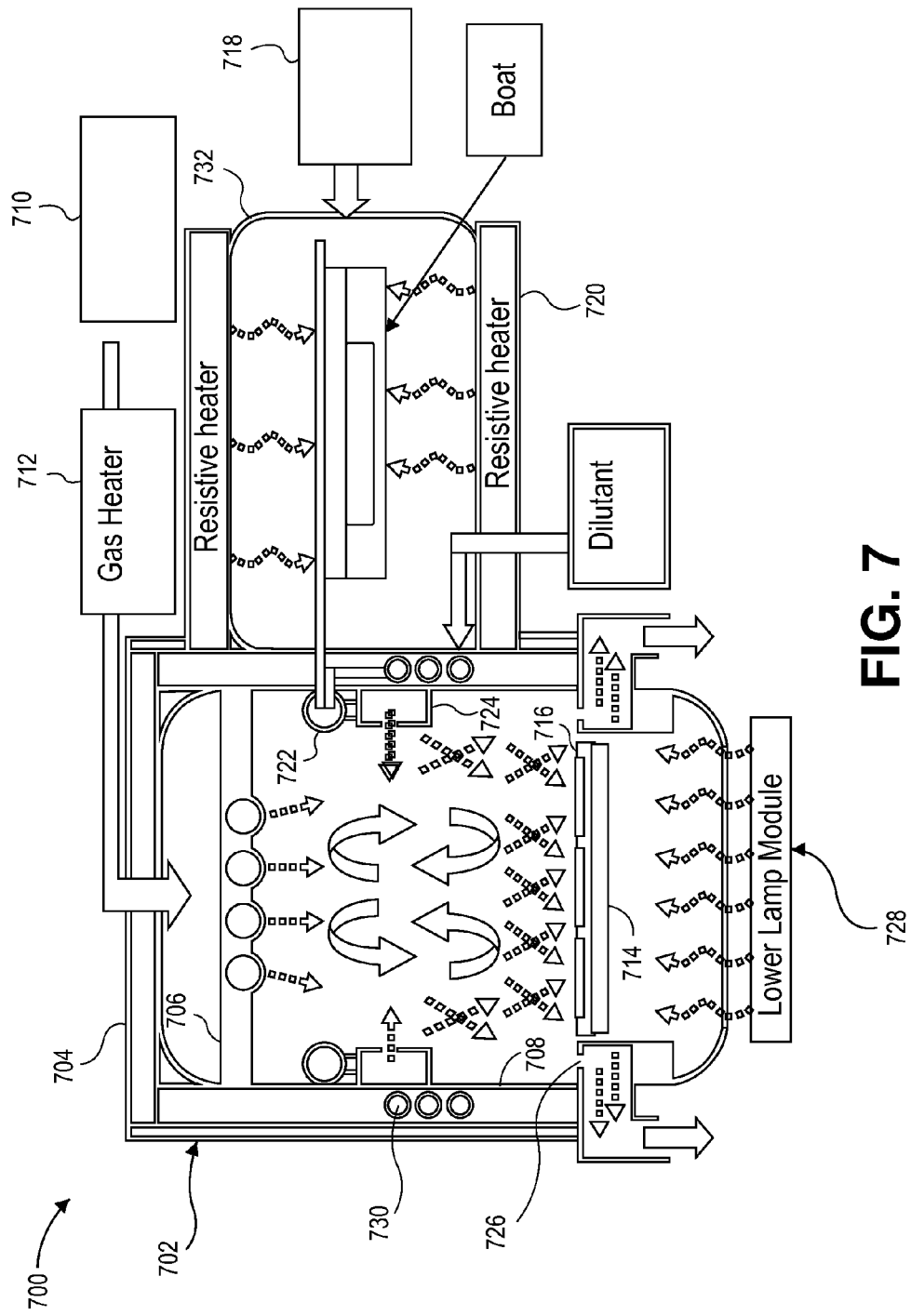
FIG. 7 is a schematic view of an HVPE apparatus, in accordance with an embodiment of the present invention.

An example of a HVPE deposition chamber which may be utilized to deposit group III-V films in an LED stack fabricated by a split chamber fabrication process, in accordance with embodiments of the present invention, is illustrated and described with respect to FIG. 7.

FIG. 7 is a schematic view of an HVPE apparatus 700 according to one embodiment. The apparatus includes a chamber 702 enclosed by a lid 704. Processing gas from a first gas source 710 is delivered to the chamber 702 through a gas distribution showerhead 706. In one embodiment, the gas source 710 may comprise a nitrogen containing compound. In another embodiment, the gas source 710 may comprise ammonia. In one embodiment, an inert gas such as helium or diatomic nitrogen may be introduced as well either through the gas distribution showerhead 706 or through the walls 708 of the chamber 702. An energy source 712 may be disposed between the gas source 710 and the gas distribution showerhead 706. In one embodiment, the energy source 712 may comprise a heater. The energy source 712 may break up the gas from the gas source 710, such as ammonia, so that the nitrogen from the nitrogen containing gas is more reactive.

To react with the gas from the first source 710, precursor material may be delivered from one or more second sources 718. The precursor may be delivered to the chamber 702 by flowing a reactive gas over and/or through the precursor in the precursor source 718. In one embodiment, the reactive gas may comprise a chlorine containing gas such as diatomic chlorine. The chlorine containing gas may react with the precursor source to form a chloride. In order to increase the effectiveness of the chlorine containing gas to react with the precursor, the chlorine containing gas may snake through the boat area in the chamber 732 and be heated with the resistive heater 720. By increasing the residence time that the chlorine containing gas is snaked through the chamber 732, the temperature of the chlorine containing gas may be controlled. By increasing the temperature of the chlorine containing gas, the chlorine may react with the precursor faster. In other words, the temperature is a catalyst to the reaction between the chlorine and the precursor.

In order to increase the reactiveness of the precursor, the precursor may be heated by a resistive heater 720 within the second chamber 732 in a boat. The chloride reaction product may then be delivered to the chamber 702. The reactive chloride product first enters a tube 722 where it evenly distributes within the tube 722. The tube 722 is connected to another tube 724. The chloride reaction product enters the second tube 724 after it has been evenly distributed within the first tube 722. The chloride reaction product then enters into the chamber 702 where it mixes with the nitrogen containing gas to form a nitride layer on the substrate 716 that is disposed on a susceptor 714. In one embodiment, the susceptor 714 may comprise silicon carbide. The nitride layer may comprise doped gallium nitride or doped aluminum nitride for example. The other reaction products, such as nitrogen and chlorine, are exhausted through an exhaust 726.

Figure 8:
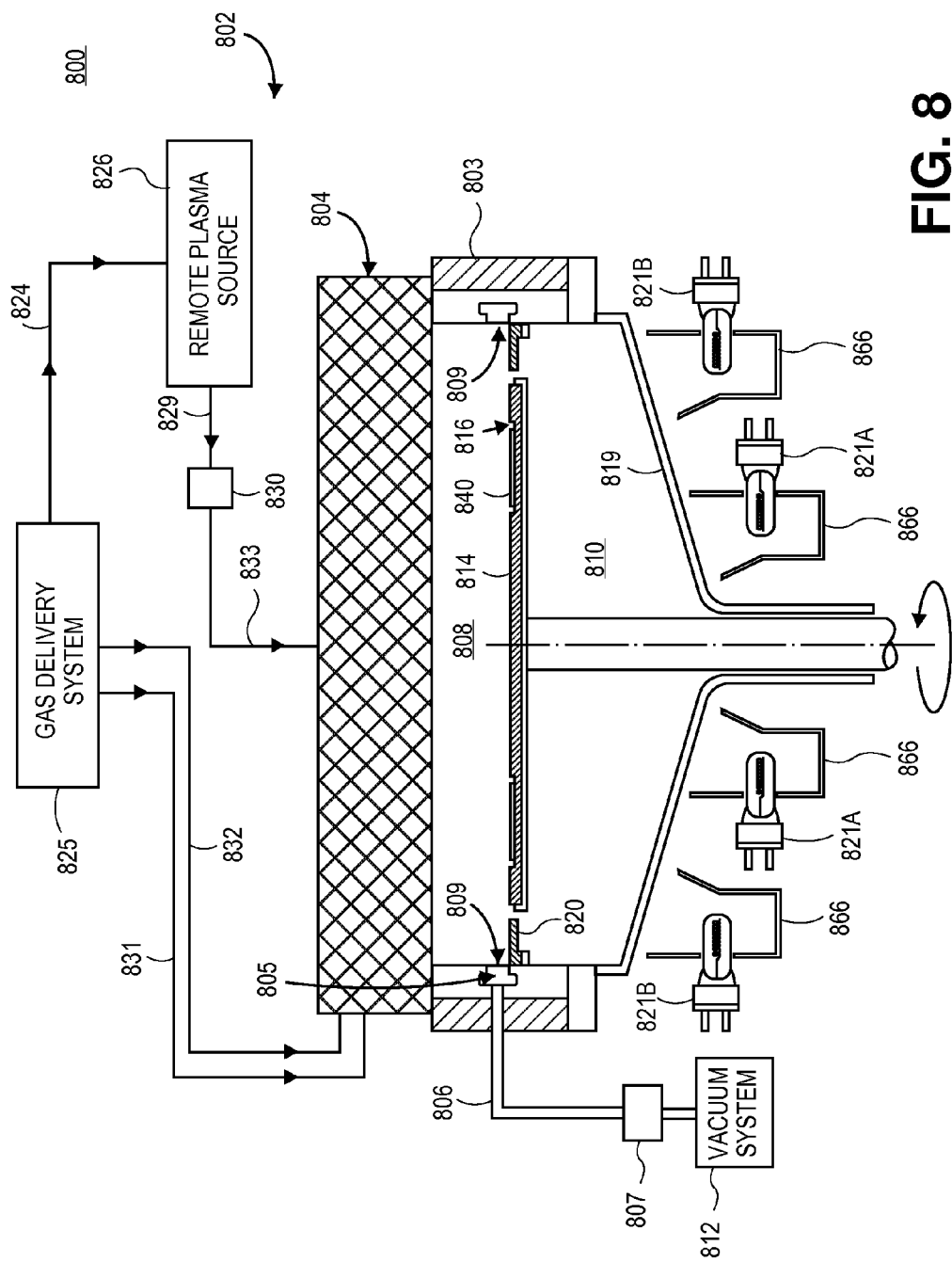
FIG. 8 is a schematic cross-sectional view of an MOCVD chamber, in accordance with an embodiment of the present invention.

An example of an MOCVD deposition chamber which may be utilized to deposit group III-V films in an LED stack fabricated by a split chamber fabrication process, in accordance with embodiments of the present invention, is illustrated and described with respect to FIG. 8.

FIG. 8 is a schematic cross-sectional view of an MOCVD chamber according to an embodiment of the invention. Exemplary systems and chambers that may be adapted to practice the present invention are described in U.S. patent application Ser. No. 11/404,516, filed on Apr. 14, 2006, and Ser. No. 11/429,022, filed on May 5, 2006, both of which are incorporated by reference in their entireties.

The apparatus 800 shown in FIG. 8 includes a chamber 802, a gas delivery system 825, a remote plasma source 826, and a vacuum system 812. The chamber 802 includes a chamber body 803 that encloses a processing volume 808. A showerhead assembly 804 is disposed at one end of the processing volume 808, and a substrate carrier 814 is disposed at the other end of the processing volume 808. A lower dome 819 is disposed at one end of a lower volume 810, and the substrate carrier 814 is disposed at the other end of the lower volume 810. The substrate carrier 814 is shown in process position, but may be moved to a lower position where, for example, the substrates 840 may be loaded or unloaded. An exhaust ring 820 may be disposed around the periphery of the substrate carrier 814 to help prevent deposition from occurring in the lower volume 810 and also help direct exhaust gases from the chamber 802 to exhaust ports 809. The lower dome 819 may be made of transparent material, such as high-purity quartz, to allow light to pass through for radiant heating of the substrates 840. The radiant heating may be provided by a plurality of inner lamps 821A and outer lamps 821B disposed below the lower dome 819, and reflectors 866 may be used to help control chamber 802 exposure to the radiant energy provided by inner and outer lamps 821A, 821B. Additional rings of lamps may also be used for finer temperature control of the substrate 840.

The substrate carrier 814 may include one or more recesses 816 within which one or more substrates 840 may be disposed during processing. The substrate carrier 814 may carry six or more substrates 840. In one embodiment, the substrate carrier 814 carries eight substrates 840. It is to be understood that more or less substrates 840 may be carried on the substrate carrier 814. Typical substrates 840 may include sapphire, silicon carbide (SiC), silicon, or gallium nitride (GaN). It is to be understood that other types of substrates 840, such as glass substrates 840, may be processed. Substrate 840 size may range from 50 mm-100 mm in diameter or larger. The substrate carrier 814 size may range from 200 mm-750 mm. The substrate carrier 814 may be formed from a variety of materials, including SiC or SiC-coated graphite. It is to be understood that substrates 840 of other sizes may be processed within the chamber 802 and according to the processes described herein. The showerhead assembly 804 may allow for more uniform deposition across a greater number of substrates 840 and/or larger substrates 840 than in traditional MOCVD chambers, thereby increasing throughput and reducing processing cost per substrate 840.

The substrate carrier 814 may rotate about an axis during processing. In one embodiment, the substrate carrier 814 may be rotated at about 2 RPM to about 100 RPM. In another embodiment, the substrate carrier 814 may be rotated at about 30 RPM. Rotating the substrate carrier 814 aids in providing uniform heating of the substrates 840 and uniform exposure of the processing gases to each substrate 840.

The plurality of inner and outer lamps 821A, 821B may be arranged in concentric circles or zones (not shown), and each lamp zone may be separately powered. In one embodiment, one or more temperature sensors, such as pyrometers (not shown), may be disposed within the showerhead assembly 804 to measure substrate 840 and substrate carrier 814 temperatures, and the temperature data may be sent to a controller (not shown) which can adjust power to separate lamp zones to maintain a predetermined temperature profile across the substrate carrier 814. In another embodiment, the power to separate lamp zones may be adjusted to compensate for precursor flow or precursor concentration non-uniformity. For example, if the precursor concentration is lower in a substrate carrier 814 region near an outer lamp zone, the power to the outer lamp zone may be adjusted to help compensate for the precursor depletion in this region.

The inner and outer lamps 821A, 821B may heat the substrates 840 to a temperature of about 400 degrees Celsius to about 1200 degrees Celsius. It is to be understood that the invention is not restricted to the use of arrays of inner and outer lamps 821A, 821B. Any suitable heating source may be utilized to ensure that the proper temperature is adequately applied to the chamber 802 and substrates 840 therein. For example, in another embodiment, the heating source may comprise resistive heating elements (not shown) which are in thermal contact with the substrate carrier 814.

A gas delivery system 825 may include multiple gas sources, or, depending on the process being run, some of the sources may be liquid sources rather than gases, in which case the gas delivery system may include a liquid injection system or other means (e.g., a bubbler) to vaporize the liquid. The vapor may then be mixed with a carrier gas prior to delivery to the chamber 802. Different gases, such as precursor gases, carrier gases, purge gases, cleaning/etching gases or others may be supplied from the gas delivery system 825 to separate supply lines 831, 832, and 833 to the showerhead assembly 804. The supply lines 831, 832, and 833 may include shut-off valves and mass flow controllers or other types of controllers to monitor and regulate or shut off the flow of gas in each line.

A conduit 829 may receive cleaning/etching gases from a remote plasma source 826. The remote plasma source 826 may receive gases from the gas delivery system 825 via supply line 824, and a valve 830 may be disposed between the showerhead assembly 804 and remote plasma source 826. The valve 830 may be opened to allow a cleaning and/or etching gas or plasma to flow into the showerhead assembly 804 via supply line 833 which may be adapted to function as a conduit for a plasma. In another embodiment, apparatus 800 may not include remote plasma source 826 and cleaning/etching gases may be delivered from gas delivery system 825 for non-plasma cleaning and/or etching using alternate supply line configurations to shower head assembly 804.

The remote plasma source 826 may be a radio frequency or microwave plasma source adapted for chamber 802 cleaning and/or substrate 840 etching. Cleaning and/or etching gas may be supplied to the remote plasma source 826 via supply line 824 to produce plasma species which may be sent via conduit 829 and supply line 833 for dispersion through showerhead assembly 804 into chamber 802. Gases for a cleaning application may include fluorine, chlorine or other reactive elements.

In another embodiment, the gas delivery system 825 and remote plasma source 826 may be suitably adapted so that precursor gases may be supplied to the remote plasma source 826 to produce plasma species which may be sent through showerhead assembly 804 to deposit CVD layers, such as III-V films, for example, on substrates 840.

A purge gas (e.g., nitrogen) may be delivered into the chamber 802 from the showerhead assembly 804 and/or from inlet ports or tubes (not shown) disposed below the substrate carrier 814 and near the bottom of the chamber body 803. The purge gas enters the lower volume 810 of the chamber 802 and flows upwards past the substrate carrier 814 and exhaust ring 820 and into multiple exhaust ports 809 which are disposed around an annular exhaust channel 805. An exhaust conduit 806 connects the annular exhaust channel 805 to a vacuum system 812 which includes a vacuum pump (not shown). The chamber 802 pressure may be controlled using a valve system 807 which controls the rate at which the exhaust gases are drawn from the annular exhaust channel 805.

It is to be understood that embodiments of the present invention are not limited to formation of layers on patterned sapphire substrates. Other embodiments may include the use of any suitable patterned single crystalline substrate upon which a Group III-Nitride epitaxial film may be formed. The patterned substrate may be formed from a substrate, such as but not limited to a sapphire ($Al_2O_3$) substrate, a silicon carbide (SiC) substrate, a silicon on diamond (SOD) substrate, a quartz ($SiO_2$) substrate, a glass substrate, a zinc oxide (ZnO) substrate, a magnesium oxide (MgO) substrate, and a lithium aluminum oxide ($LiAlO_2$) substrate. Any well know method, such as masking and etching may be utilized to form features, such as posts, from a planar substrate to create a patterned substrate. In a specific embodiment, however, the patterned substrate is a (0001) patterned sapphire substrate (PSS). Patterned sapphire substrates may be ideal for use in the manufacturing of LEDs because they increase the light extraction efficiency which is extremely useful in the fabrication of a new generation of solid state lighting devices. Other embodiments include the use of planar (non-patterned) substrates, such as a planar sapphire substrate.

In some embodiments, growth of a gallium nitride or related film on a substrate is performed along a (0001) Ga-polarity, N-polarity, or non-polar a-plane {112-0} or m-plane {101-0}, or semi-polar planes. In some embodiments, posts formed in a patterned growth substrate are round, triangular, hexagonal, rhombus shape, or other shapes effective for block-style growth. In an embodiment, the patterned substrate contains a plurality of features (e.g., posts) having a cone shape. In a particular embodiment, the feature has a conical portion and a base portion. In an embodiment of the present invention, the feature has a tip portion with a sharp point to prevent over growth. In an embodiment, the tip has an angle ($\Theta$) of less than 145° and ideally less than 110°. Additionally, in an embodiment, the feature has a base portion which forms a substantially 90° angle with respect to the xy plane of the substrate. In an embodiment of the present invention, the feature has a height greater than one micron and ideally greater than 1.5 microns. In an embodiment, the feature has a diameter of approximately 3.0 microns. In an embodiment, the feature has a diameter height ratio of approximately less than 3 and ideally less than 2. In an embodiment, the features (e.g., posts) within a discrete block of features (e.g., within a block of posts) are spaced apart by a spacing of less than 1 micron and typically between 0.7 to 0.8 microns.

It is also to be understood that embodiments of the present invention need not be limited to n-GaN as a group III-V layer formed on a patterned substrate. For example, other embodiments may include any Group III-Nitride epitaxial film that can be suitably deposited by hydride vapor phase epitaxy or MOCVD, or the like, deposition. The Group III-Nitride film may be a binary, ternary, or quaternary compound semiconductor film formed from a group III element or elements selected from gallium, indium and aluminum and nitrogen. That is, the Group III-Nitride crystalline film can be any solid solution or alloy of one or more Group III element and nitrogen, such as but not limited to GaN, AlN, InN, AlGaN, InGaN, InAlN, and InGaAlN. However, in a specific embodiment, the Group III-Nitride film is an n-type gallium nitride (GaN) film. The Group III-Nitride film can have a thickness between 2-500 microns and is typically formed between 2-15 microns. Thicknesses greater than 500 microns are possible because of, e.g., the high growth rate of HYPE. In an embodiment of the present invention, the Group III-Nitride film has a thickness of at least 3.0 microns to sufficiently suppress threading dislocations. Additionally, as described above, the Group III-Nitride film can be doped. The Group III-Nitride film can be p-typed doped using any p-type dopant such as but not limited Mg, Be, Ca, Sr, or any Group I or Group II element have two valence electrons. The Group III-Nitride film can be p-type doped to a conductivity level of between $1\times10^{16}$ to $1\times10^{20}$ atoms/cm$^3$.

It is also to be understood that embodiments of the present invention need not be limited to the fabrication of LEDs. For example, in another embodiment, devices other than LED devices may be fabricated, such as but not limited to field-effect transistor (FET) devices. In such embodiments, there may not be a need for a p-type material on top of a structure of layers. Instead, an n-type or un-doped material may be used in place of the p-type layer.

Thus, surface passivation techniques for multiple-chamber split processes have been disclosed. In accordance with an embodiment of the present invention, surface passivation by a thin layer of metallic species, or other compound layer, is used to preserve the top surface of a III-V layer during a split in chamber processing of an LED stack.

What is claimed is:

1. A method of fabricating a semiconductor stack, the method comprising:
    forming, in a first process chamber, a first Group III-V material layer above a substrate, the first Group III-V material layer having a top surface; and, without removing the substrate from the first process chamber,
    depositing, in the first process chamber, a passivation layer on the top surface of the Group III-V material layer; and, subsequently,
    removing the substrate from the first process chamber;
    inserting the substrate into a second process chamber;
    removing, in the second process chamber, the passivation layer; and, without removing the substrate from the second process chamber,
    forming, in the second process chamber, a second Group III-V material layer above the first Group III-V material layer.

2. The method of claim 1, wherein depositing the passivation layer comprises depositing a metallic layer selected from the group consisting of an indium layer, a gallium layer, and an aluminum layer.

3. The method of claim 2, wherein depositing the passivation layer comprises forming the passivation layer, in an absence of ammonia (NH$_3$) flow, at a temperature approximately in a range of 300-700 degrees Celsius.

4. The method of claim 1, wherein depositing the passivation layer comprises depositing a compound layer selected from the group consisting of an indium nitride (InN) layer, a silicon nitride (SiN) layer, and indium aluminum nitride (In-AlN) layer, and an indium gallium nitride (InGaN) layer.

5. The method of claim 1, wherein forming the first Group III-V material layer comprises forming a first crystalline Group III-V material layer, depositing the passivation layer comprises depositing an amorphous passivation layer, and forming the second Group III-V material layer comprises forming a second crystalline Group III-V material layer.

6. The method of claim 1, wherein removing the passivation layer comprises removing a metallic layer or a compound layer with a temperature ramp or a hydrogen (H$_2$) purge.

7. The method of claim 1, wherein forming the first Group III-V material layer comprises forming an n-type gallium nitride (n-GaN) layer, depositing the passivation layer comprises depositing a metallic layer or a compound layer, and forming the second Group III-V material layer comprises forming a gallium nitride (GaN) layer of a multiple quantum well (MQW) region.

8. The method of claim 1, wherein forming the first Group III-V material layer comprises forming a gallium nitride (GaN) layer of a multiple quantum well (MQW) region, depositing the passivation layer comprises depositing a metallic layer or a compound layer, and forming the second Group III-V material layer comprises forming a p-type gallium nitride (p-GaN) layer.

9. The method of claim 1, wherein the second process chamber is a chamber different from the first process chamber.

10. The method of claim 1, wherein the second process chamber is the same chamber as the first process chamber.

* * * * *